US010283608B2

(12) United States Patent
Zhang et al.

(10) Patent No.: US 10,283,608 B2
(45) Date of Patent: May 7, 2019

(54) LOW RESISTANCE CONTACTS TO SOURCE OR DRAIN REGION OF TRANSISTOR

(71) Applicant: GLOBALFOUNDRIES INC., Grand Cayman (KY)

(72) Inventors: Xunyuan Zhang, Albany, NY (US); Frank Mont, Troy, NY (US); Mark Raymond, Latham, NY (US); Chengyu Niu, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 28 days.

(21) Appl. No.: 15/461,634

(22) Filed: Mar. 17, 2017

(65) Prior Publication Data
US 2018/0269297 A1    Sep. 20, 2018

(51) Int. Cl.
*H01L 21/4763* (2006.01)
*H01L 21/70* (2006.01)
*H01L 29/45* (2006.01)
*H01L 29/66* (2006.01)
*H01L 21/28* (2006.01)
*H01L 29/08* (2006.01)
(Continued)

(52) U.S. Cl.
CPC ........ *H01L 29/45* (2013.01); *H01L 21/28008* (2013.01); *H01L 21/2855* (2013.01); *H01L 21/28518* (2013.01); *H01L 21/28568* (2013.01); *H01L 21/76802* (2013.01); *H01L 21/76846* (2013.01); *H01L 21/76877* (2013.01); *H01L 21/76889* (2013.01); *H01L 29/0847* (2013.01); *H01L 29/41783* (2013.01); *H01L 29/665* (2013.01); *H01L 29/66795* (2013.01); *H01L 29/7851* (2013.01)

(58) Field of Classification Search
CPC ........... H01L 29/66795; H01L 29/7851; H01L 21/82343; H01L 29/45; H01L 21/28008; H01L 21/28518; H01L 21/2855; H01L 21/28568; H01L 21/76802; H01L 21/76846; H01L 21/76877; H01L 21/76889; H01L 29/0847; H01L 29/41783; H01L 29/665
See application file for complete search history.

(56) References Cited

U.S. PATENT DOCUMENTS 6,060,154 A    5/2000  Adachi et al.
6,780,758 B1   8/2004  Derderian et al.
(Continued)

OTHER PUBLICATIONS

Wen, LG, et al.; "Atomic Layer Deposition of Ruthenium with TiN Interface for Sub-10 nm Advanced Interconnects beyond Copper"; ACS Appl Mater Interfaces, Oct. 5, 2016; 8(39): 26119-26125 Epub Sep. 21, 2016.

*Primary Examiner* — Alonzo Chambliss
(74) *Attorney, Agent, or Firm* — David Cain; Hoffman Warnick LLC

(57) ABSTRACT

A conductive source/drain contact is formed within a trench overlying a raised epitaxial source/drain junction. The conductive contact includes a conductive liner and a conductive fill material formed directly over the conductive liner. The conductive fill material is selected from a platinum group metal such as ruthenium. The conductive liner may be directionally deposited into the trench and is adapted to form a metal silicide in situ through a reaction with the epitaxial layer.

11 Claims, 6 Drawing Sheets

(51) Int. Cl.
   *H01L 21/768* (2006.01)
   *H01L 21/285* (2006.01)
   *H01L 29/78* (2006.01)
   *H01L 29/417* (2006.01)

(56) References Cited

U.S. PATENT DOCUMENTS

| | | |
|---|---|---|
| 7,256,123 B2 | 8/2007 | Derderian et al. |
| 8,748,309 B2 * | 6/2014 | Xie ................ H01L 29/4958 257/E21.577 |
| 8,927,353 B2 | 1/2015 | Hsu et al. |
| 8,975,613 B1 | 3/2015 | Kuse et al. |
| 9,048,415 B2 | 6/2015 | Collins et al. |
| 9,287,403 B1 | 3/2016 | Lee et al. |
| 9,431,486 B1 | 8/2016 | Ok et al. |
| 9,502,308 B1 * | 11/2016 | Park ............... H01L 21/823871 |
| 9,882,025 B1 * | 1/2018 | Zhang ............. H01L 29/66666 |
| 10,069,011 B2 * | 9/2018 | Bouche ............. H01L 29/7848 |
| 2012/0205719 A1 * | 8/2012 | Juengling ....... H01L 21/823431 257/204 |
| 2016/0013104 A1 * | 1/2016 | Hung ............... H01L 21/76897 257/288 |
| 2016/0049483 A1 * | 2/2016 | Zhang ............. H01L 29/66545 257/401 |
| 2016/0379925 A1 * | 12/2016 | Ok .................. H01L 21/76895 257/288 |
| 2017/0222018 A1 * | 8/2017 | Zhang ............. H01L 29/42384 |

* cited by examiner

US 10,283,608 B2

LOW RESISTANCE CONTACTS TO SOURCE OR DRAIN REGION OF TRANSISTOR

BACKGROUND

The present application relates generally to semiconductor devices, and more specifically to conductive contacts for fin-type field effect transistors and their methods of fabrication.

Fully depleted devices such as fin field effect transistors (finFETs) are candidates for scaling of gate lengths to 14 nm and below. The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The narrow, three-dimensional fin geometry may be beneficial for electrostatic control the transistor channel, but can lead to increased contact resistance in the source/drain regions of the device. A larger contact area (and therefore less contact resistance) can be provided by merging the source/drain regions of adjacent fins, and the contact resistance may be decreased further by converting an upper portion of epitaxial junctions in the source/drain regions to a silicide.

In conventional FinFET structures, electrical contact to the source/drain region is typically made through a contact trench that extends through a dielectric layer. A conductive contact is formed within the trench. The conductive contact conventionally includes a fill metal such as tungsten and a liner/barrier layer between the fill metal and the dielectric walls of the trench.

One factor that contributes to the overall performance of such conductive contacts is the resistance contribution of the liner/barrier layers, which are incorporated into the structure to promote nucleation and adhesion of the fill metal layer and/or inhibit diffusion or segregation of the fill metal into adjacent structures, including the dielectric layer. However, as device architectures scale to smaller critical dimensions and higher densities, conventional liner/barrier layers can have an adverse effect on the total resistance through the conductive contact. It would therefore be beneficial to provide a conductive contact architecture having a minimal footprint and low overall resistance.

SUMMARY

A conductive source/drain contact is formed within a trench overlying a raised epitaxial source/drain junction. The conductive contact includes a conductive liner and a conductive fill material that is selected from a platinum group metal. An exemplary conductive fill material is ruthenium. The conductive liner may be directionally deposited into the trench and is adapted to form a metal silicide in situ through a reaction with the epitaxial layer.

In particular embodiments, a titanium nitride barrier layer is excluded from the conductive source/drain contact, and the conductive fill material is deposited directly on the conductive liner. In alternate embodiments where a titanium nitride barrier layer is included, the titanium nitride may be directionally deposited into the trench such that the titanium nitride layer thickness along the trench sidewalls is less than its thickness at the bottom of the trench, i.e., directly over the epitaxial source/drain junction.

In accordance with embodiments of the present application, a method of forming a semiconductor device includes forming a gate structure on a channel portion of a semiconductor fin, where a source region and a drain region are present on opposing sides of the channel portion. An epitaxial layer is formed over the source region and the drain region, and a dielectric layer is formed over the gate structure.

The method further includes forming a trench that extends through the dielectric layer to an exposed surface of at least one of the source region and the drain region. A metal liner is formed over sidewalls of the trench and over the at least one of the source region and the drain region. A platinum metal group-containing conductive fill material is then formed over the metal liner to fill the trench.

A exemplary semiconductor structure formed using the disclosed process includes a dielectric layer disposed over a semiconductor substrate, a trench extending through the dielectric layer, and a conductive contact disposed within the trench. The conductive contact includes a metal liner disposed over sidewalls of the trench and a conductive fill layer made from a platinum group metal disposed over the metal liner.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
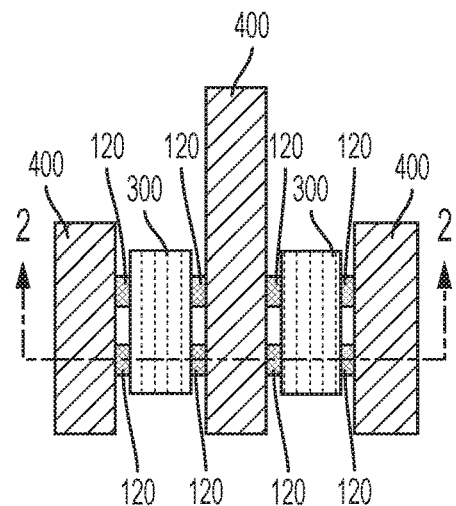
FIG. 1 is a top-down simplified schematic diagram of a FinFET device according to various embodiments.

Reference will now be made in greater detail to various embodiments of the subject matter of the present application, some embodiments of which are illustrated in the accompanying drawings. The same reference numerals will be used throughout the drawings to refer to the same or similar parts.

Disclosed is a FinFET architecture including source/drain contacts disposed over source and drain regions of a FinFET structure or device. The source/drain contacts are formed within trenches that extend through a dielectric layer that overlies one or more fins. The trenches expose raised epitaxial source/drain junctions formed over source/drain regions of the fins. In exemplary embodiments, the source/drain contacts include a platinum metal group conductive fill material selected from the group consisting of ruthenium, rhodium, palladium, osmium, iridium and platinum. The use of a platinum metal group conductive fill material can simplify the geometry of the associated barrier layer(s).

During manufacture, the conductive contacts further comprise a conductive metal liner that is directionally deposited into the trenches prior to depositing the conductive fill material. The liner is adapted to form a metal silicide in situ through a reaction with the epitaxial source/drain junctions. The conductive metal liner may comprise nickel or titanium, for example.

In particular embodiments, a titanium nitride barrier layer is excluded from the source/drain contact. In such embodiments, the conductive fill material is deposited directly over the conductive metal liner. In alternate embodiments where a titanium nitride barrier layer is included, the titanium nitride layer may be deposited directionally into the trench such that the titanium nitride layer thickness along the sidewalls of the trench is less than the thickness at the bottom of the trench.

Accordingly, the present disclosure relates to a FinFET structure with low source/drain contact resistance and a method of manufacturing such a structure. Embodiments of the present disclosure, including a method for forming the FinFET structure are now described in detail with reference to FIGS. 1-9.

Figure 2:
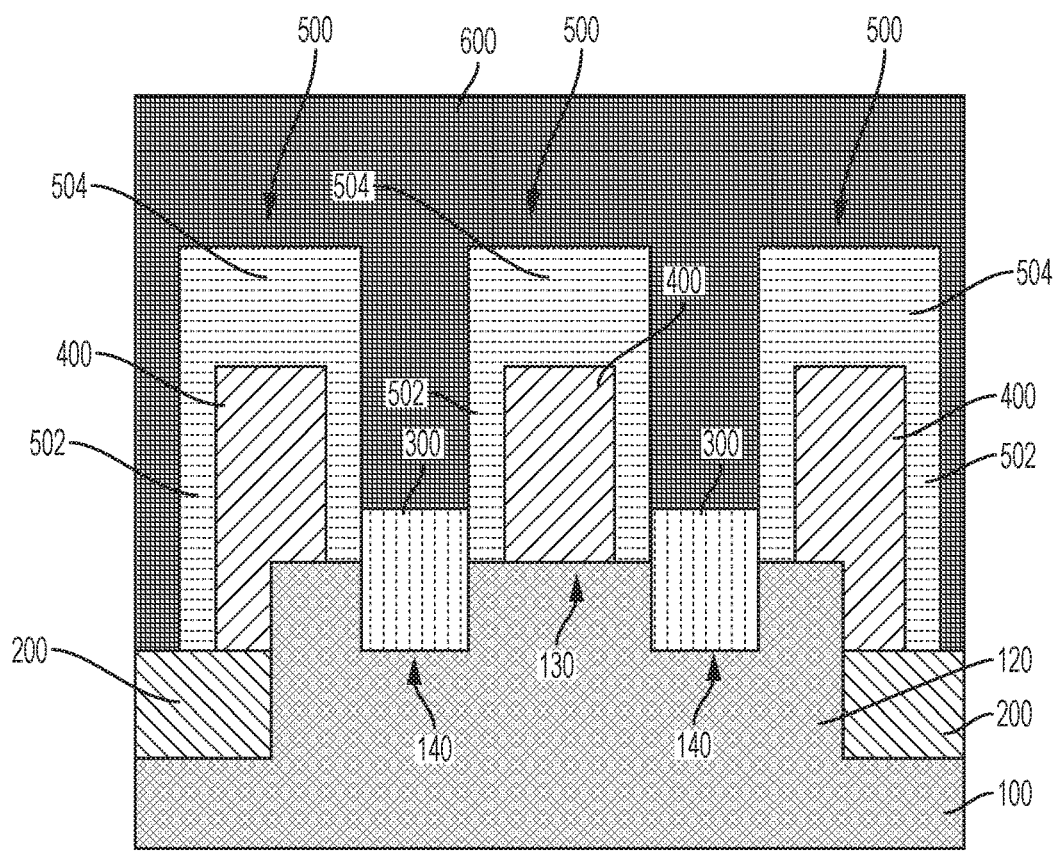
FIG. 2 is a cross-sectional view of the device of FIG. 1 along the line 2 showing raised epitaxial source/drain junctions formed over source/drain regions of a semiconductor fin and an interlayer dielectric disposed over the epitaxial source/drain junctions.

Referring to FIG. 1, illustrated is a top-down, cut-away schematic diagram of an example FinFET structure at an intermediate stage of fabrication according to various embodiments. FIG. 2 is a cross-sectional view of the structure in FIG. 1 along the line 2.

The FinFET structure includes a set of fins 120 arrayed on a semiconductor substrate 100 and a gate structure 400 formed over at least an adjacent pair of the set of fins, i.e., over respective channel regions 130 of the fins, where the adjacent pair of fins 120 each extend laterally from the channel region 130 into source/drain (S/D) regions 140 and an epitaxial layer 300 is grown on top surfaces and facing sidewalls of the adjacent pair fins within the S/D regions 140. Fins are electrically isolated from one other by a shallow trench isolation layer 200, as known to those skilled in the art. A dielectric capping layer 500 and an interlayer dielectric 600 are disposed over the fins 120, shallow trench isolation 200, and gate structures 400.

According to various embodiments, substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multilayers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer, and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

In various embodiments, fins 120 comprise a semiconductor material, and may be formed by patterning and then etching the semiconductor substrate 100, i.e., a top portion of the semiconductor substrate. In several embodiments, the fins 120 are etched from, and therefore contiguous with the semiconductor substrate 100. In certain embodiments, fins may be formed using a sidewall image transfer (SIT) process or a double patterning (DP) process as known to those skilled in the art.

As used herein, a "fin" refers to a contiguous semiconductor material that includes a pair of vertical sidewalls that are parallel to each other. As used herein, a surface is "vertical" if there exists a vertical plane from which the surface does not deviate by more than three times the root mean square roughness of the surface. Each of a plurality of fins 120 can comprise a single crystal semiconductor material that extends along a lengthwise direction. As used herein, a "lengthwise direction" is a horizontal direction along with an object extends the most. A "widthwise direction" (W) is a horizontal direction that is perpendicular to each of a fin height (H) and a lengthwise direction.

In various embodiments, the as-formed fins 120 are free standing, i.e., supported only by the substrate. Each fin has a height (H) that may range from 10 nm to 100 nm and a width (W) that may range from 4 nm to 30 nm. Other heights and widths that are less than or greater than the ranges mentioned can also be used. The fins 300 may have an aspect ratio (H/W) ranging from 1 to 5, e.g., 1, 1.5, 2, 3, 4 or 5, including ranges between any of the foregoing values. Plural fins may have identical or substantially identical dimensions, i.e., height and/or width. As used herein, substantially identical dimensions vary by less than 10%, e.g., less than 5%, 2% or 1%.

In structures comprising plural fins, i.e., a fin array, each fin may be spaced apart from its nearest neighbor by a periodicity or pitch (d) of 15 nm to 100 nm, e.g., 15, 20, 25, 30, 40, 50, 75 or 100 nm, including ranges between any of the foregoing values. Such plural fins are typically oriented parallel to each other and perpendicular to the library logic flow of a circuit. Across a fin array, the fins may have uniform dimensions and/or a uniform spacing.

In various embodiments, each of a plurality of semiconductor fins 120 extends along a lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction.

The substrate 100, the fins 120, or both can be doped. As known to those skilled in the art, doping changes the electron and hole carrier concentrations of an intrinsic semiconductor at thermal equilibrium. A doped layer or region may be p-type or n-type. As used herein, "p-type" refers to the addition of impurities to an intrinsic semiconductor that creates a deficiency of valence electrons. For silicon, example p-type dopants, i.e., impurities, include but are not limited to, boron, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus. A p-type dopant is used to manufacture a PFET and an n-type dopant is used to manufacture an NFET.

By way of non-limiting example, a doped region, e.g., source or drain region 140, is doped with arsenic or phosphorus to form an n-type region. In another example, a doped region is doped with boron to form a p-type region. The dopant concentration within the source and drain regions 140 may range from $1\times10^{19}$ atoms/cm$^3$ to $5\times10^{22}$ atoms/cm$^3$, e.g., $1\times10^{19}$, $2\times10^{19}$, $5\times10^{19}$, $1\times10^{20}$, $2\times10^{20}$, $5\times10^{20}$, $1\times10^{21}$, $2\times10^{21}$, $5\times10^{21}$, $1\times10^{22}$, $2\times10^{22}$ and $5\times10^{22}$ atoms/cm$^3$, including ranges between any of the foregoing values.

The dopant profile within the fins 120 may be constant or variable. For example, after an annealing step to activate the dopant(s), the dopant concentration within the fins may vary laterally, i.e., along a widthwise direction of the fins, with a minimum dopant concentration (e.g., $1\times10^{19}$ to $<5\times10^{22}$ atoms/cm$^3$) along a central axis of the fins and a maximum dopant concentration (e.g., $>1\times10^{19}$ to $5\times10^{22}$ atoms/cm$^3$) at opposing sidewall surfaces thereof. In further embodiments, the dopant concentration within the fins may vary along a lengthwise direction of the fins.

Referring still to FIG. 2, raised epitaxial source/drain junctions 300 are formed over the source/drain regions 140 of the illustrated fin 120, and an interlayer dielectric 600 such as a layer of silicon dioxide, is disposed over the epitaxial source/drain junctions 300. In the illustrated embodiment, the interlayer dielectric 600 is disposed directly over the source/drain junctions 300, which facilitates the later formation of self-aligned trenches.

Raised source/drain junctions 300 may be formed by epitaxial growth directly onto exposed portions of fins 120. The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Example epitaxial growth processes include low energy plasma deposition, liquid phase epitaxy, molecular beam epitaxy, and atmospheric pressure chemical vapor deposition.

In conjunction with various embodiments, the epitaxial growth naturally forms into shaped structures (referred to herein as diamond-shaped or faceted structures) having upper and lower sloped surfaces. The faceted shape results from the different relative growth rates over different crystallographic orientations. For example, the growth rate of an epitaxial layer on silicon (Si) surfaces having (111) orientations is slower than that on other planes such as (110) or (100) planes. Accordingly, the resultant diamond-shaped structures result from the slowest epitaxial growth rate on the (111) surface.

In embodiments, lengths of the facets are substantially the same and can be controlled by the epitaxial growth process conditions, such as growth rate and growth time. Compared to a rectangular shape, the diamond-shaped raised active regions have the advantage of a greater surface area and volume in the active regions, and the flexibility of a multi-layer fin structure (e.g., SiGe diamonds on Si fins).

The epitaxial material can grow from a fin such that upper sloped surface slopes from the top of the fin toward the substrate. As shown in FIG. 1, epitaxial growth can proceed to enable the growth from adjacent fin sidewalls to merge, that is, to extend more than half the lateral distance between the adjacent fins. In other embodiments, epitaxial growth can be un-merged. In any event, a spacer layer 502 is typically present on sidewalls of gate structure 400 such that the epitaxial growth in the source/drain regions 140 is separated from the gate structure.

In addition to, or in lieu of, raised epitaxial source and drain regions, a blanket doping technique may be used to (further) dope source and drain regions 140 within the fins 120. Suitable doping techniques may include, but are not limited to, ion implantation, gas phase doping, plasma doping, plasma immersion ion implantation, cluster doping, infusion doping, liquid phase doping, solid phase doping, or any suitable combination of those techniques. In one embodiment, dopants may be implanted by one or more rounds of angled ion implantation. In alternate embodiments, ion implantation to dope source/drain junctions may be performed before or after the formation of the raised active regions. For instance, doping of the source/drain junctions by ion implantation may be used to supplement doping by diffusion from one or more epitaxial layers, or vice versa.

The gate structure 400 is formed over exposed surfaces of the fins 120 within the channel region 130 thereof. One or more gate structures are typically oriented perpendicular to the fins 120, but an orthogonal orientation is not required. As known to those skilled in the art, the gate structure 400, i.e., a gate stack, comprises a gate dielectric formed directly over the fins and a gate conductor formed over the gate conductor (not separately shown). A dielectric gate cap 504, is commonly formed over the gate structure. The gate cap 504 may be contiguous with the sidewall spacers 502.

The gate dielectric may be formed by conformally depositing a dielectric material by CVD or atomic layer deposition (ALD). Gate dielectric layer may comprise silicon dioxide, silicon nitride, silicon oxynitride, a high-k dielectric, or other suitable material. As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, HfSiO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, SiO$_x$N$_y$, SiN$_x$, a silicate thereof, and an alloy thereof. Each value of x may independently vary from 0.5 to 3, and each value of y may independently vary from 0 to 2. The gate dielectric thickness may range from 1 nm to 10 nm, e.g., 1, 2, 4, 6, 8 or 10 nm, including ranges between any of the foregoing. In some embodiments, the gate dielectric can be a multilayer structure comprising different gate dielectric materials, e.g., silicon dioxide, and a high k dielectric material.

The gate electrode can be any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

The gate electrode layer can be formed utilizing conventional deposition such as CVD, PECVD, PVD, ALD, etc., and conventional silicidation if the electrode is a silicide material.

The dielectric capping layer 500, which includes sidewall spacers 502 and a top cap 504, is disposed over the gate structure 400. Dielectric capping layer 500 is formed from an insulating material and separates the source/drain regions 140 and associated epitaxial source/drain junctions 300 on either side of the gate from the gate conductor. The dielectric capping layer 500 can be any dielectric material such as silicon dioxide, silicon nitride, silicon oxynitride, a dielectric metal oxide, a dielectric metal nitride, a dielectric metal oxynitride, or a combination thereof.

Figure 3:
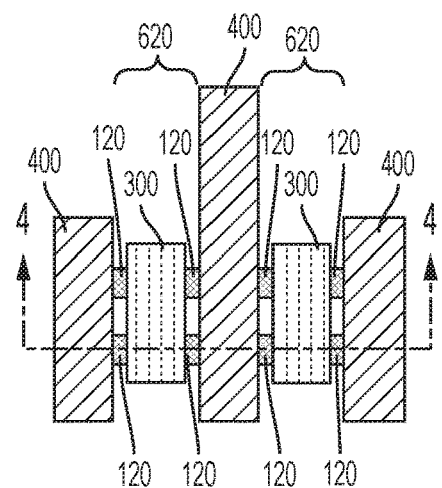
FIG. 3 is a top-down simplified schematic diagram of a FinFET device showing the locations of trenches formed over source/drain junctions.
Figure 4:
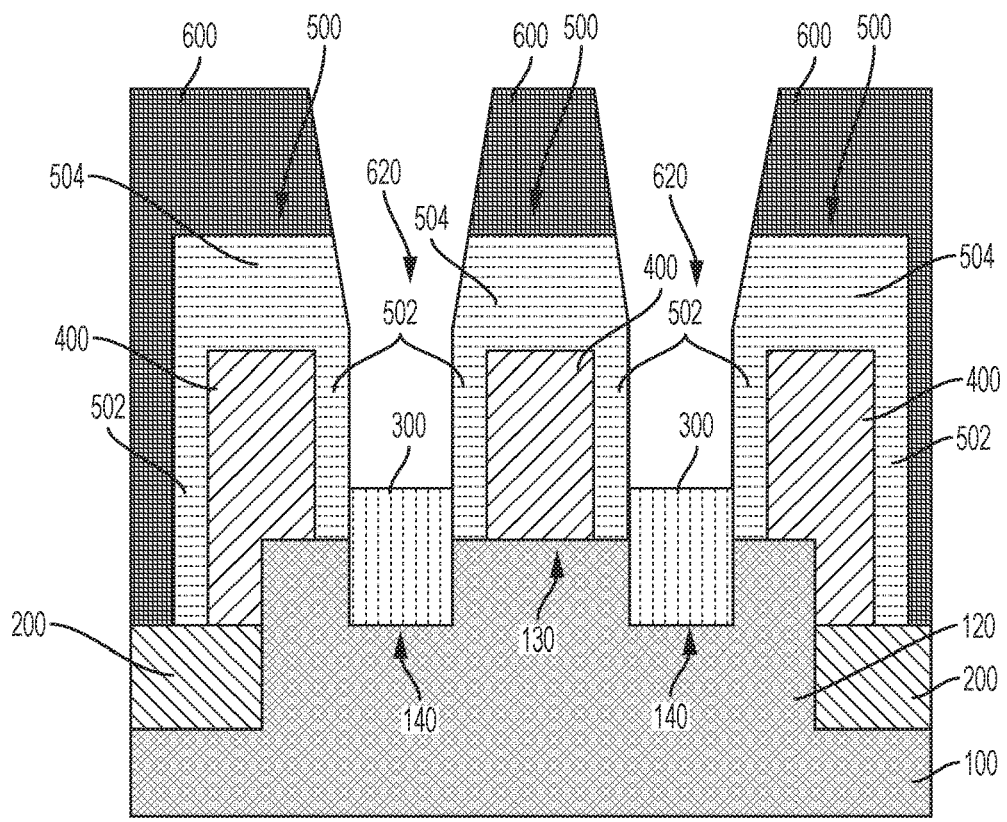
FIG. 4 depicts the formation of a trench through both the interlayer dielectric and a self-aligned capping layer exposing the source/drain junctions.

Referring to FIGS. 3 and 4, a trench 620 is formed extending through interlayer dielectric 600 and dielectric capping layer 500 between adjacent gate structures 400, i.e., between the sidewall spacers 502 of dielectric capping layer 500 formed over adjacent gate structures, to expose epitaxial source/drain junctions 300. Trench 620 can extend generally parallel to gate structures 400 while being laterally spaced therefrom.

Trench 620 may be formed using patterning and etching processes known to those skilled in the art. The patterning process may comprise photolithography, for example, which includes forming a layer of photoresist material (not shown) atop a material or material structure to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the underlying dielectric layer or dielectric layers utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

Figure 5:
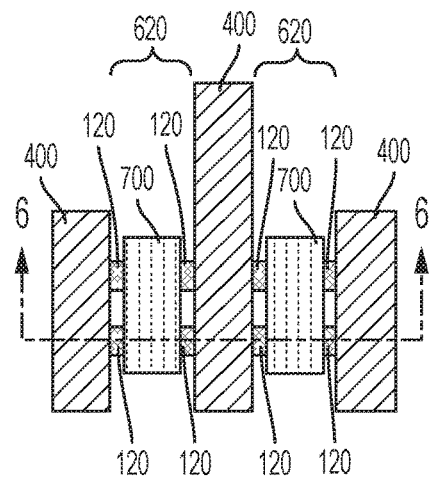
FIG. 5 is a top-down simplified schematic diagram of a FinFET device after the formation of a liner and a conductive fill layer within trenches over source/drain junctions.
Figure 6:
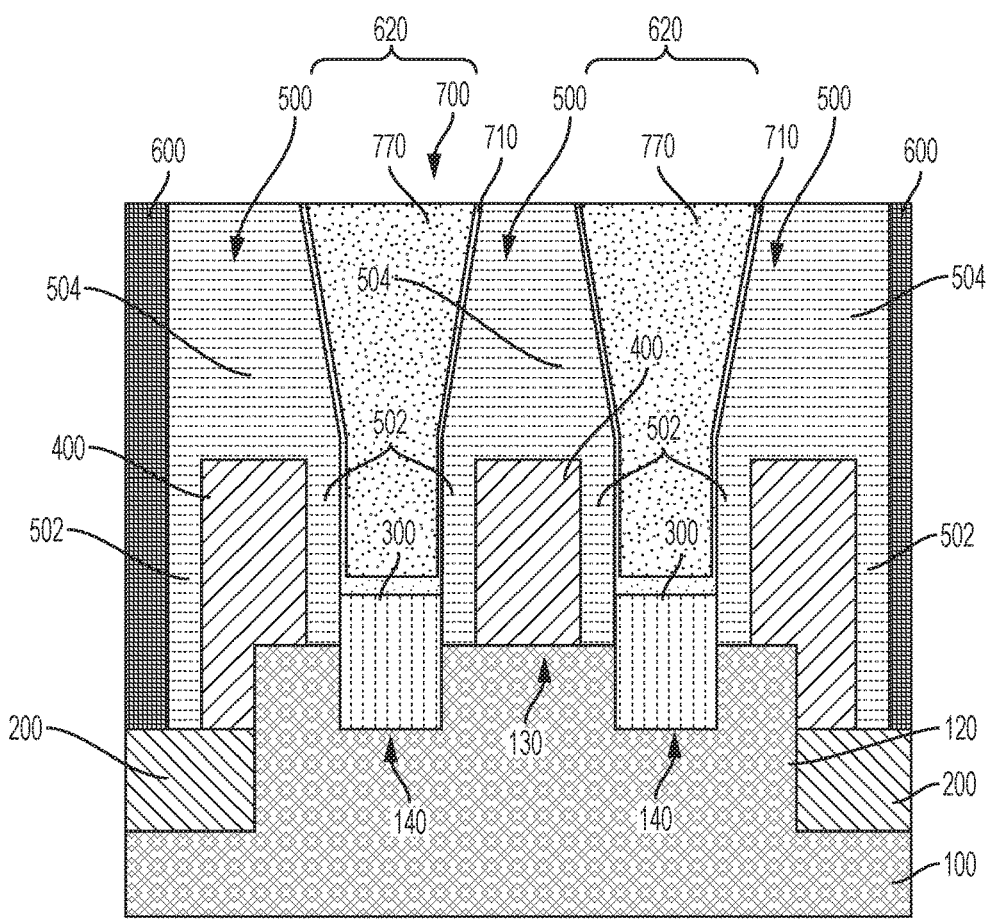
FIG. 6 shows the deposition of the liner within the trench and the subsequent formation of a conductive fill layer comprising a platinum group metal according to several embodiments.

Referring to FIGS. 5 and 6, according to certain embodiments, depicted is a conductive contact 700 at an intermediate stage of fabrication. Conductive contact 700 includes a liner 710, and a conductive fill layer 770 formed over the liner 710 and within trench 620. In the illustrated embodiment, the conductive fill layer 770 is deposited directly over the liner 710 without any intervening barrier layer(s). Liner 710 may be adapted to serve as a nucleation layer and/or adhesion layer for the deposition of the fill layer 770 used to fill the remaining portion of the trench 620.

For instance, liner 710 may be formed directly over sidewalls of dielectric capping layer 500 within the trench 620 and over source/drain junctions 300 at the bottom of the trench 620. Liner 710 can be formed by depositing a metal silicide-forming metal in trench 620. Example metal silicide-forming metals include titanium (Ti), cobalt (Co), nickel (Ni) and platinum (Pt).

The thickness of the liner 710 may range from 1 nm to 10 nm, e.g., 1, 2, 4, 6, 8 or 10 nm, including ranges between any of the foregoing values. In certain embodiments, a collimated or other directional deposition process may be used to form the liner. For instance, liner 710 may be formed using physical vapor deposition (PVD) or other suitable processes for creating a thin film.

Examples of physical vapor deposition (PVD) techniques that are suitable for forming the layers and structures described herein include sputtering and plating. "Sputtering" refers to a method of depositing a layer of material whereby a target of the desired material, i.e., source, is bombarded with particles, e.g., ions, which eject atoms from the target, and the dislodged target material is deposited on a substrate such as a semiconductor substrate. Examples of sputtering apparatuses include DC diode type systems, radio frequency (RF) sputtering, magnetron sputtering, and ionized metal plasma (IMP) sputtering.

In particular embodiments, the thickness of the liner 710 at the bottom of the trench may be greater than the thickness along the trench sidewalls. For instance, at the bottom of the trench the liner may have a thickness of 2 to 10 nm, while along the sidewalls of the trench the liner may have a thickness of 1 to 2 nm. In exemplary embodiments, a ratio of the liner thickness at the bottom of the trench to the liner thickness along the sidewalls of the trench can range from 2 to 10, e.g., 2, 4, 6, 8 or 10, including ranges between any of the foregoing values. The liner (e.g., titanium) deposited at the bottom of the trench 620 provides a layer that, when annealed, forms a silicide (e.g., titanium silicide) by reaction with the epitaxial layer 300

Prior to forming the silicide, a fill material 770 may be deposited on exposed surfaces of the liner 710 to form a conductive contact 700 that substantially fills trench 620. The fill material 770 may be deposited by chemical vapor deposition (CVD) or atomic layer deposition (ALD), for example.

According to several embodiments, conductive fill layer 770 may comprise a platinum group metal, or may be selected from the iridium sub-group or the palladium sub-group of the platinum group metals. The platinum group metals include ruthenium, rhodium, palladium, osmium, iridium and platinum. The iridium sub-group includes iridium, ruthenium and osmium. The palladium sub-group includes palladium, rhodium and platinum.

In exemplary embodiments, the conductive fill layer may include an elemental platinum-group metal as well as alloys and mixtures that contain a platinum-group metal. By way of non-limiting example, the fill layer 770 may comprise ruthenium metal or a ruthenium alloy, e.g., ruthenium alloyed with up to 50 atomic percent of one or more of B, C, N, Mg, Al, Si, P, Ti, V, Cr, Mn, Fe, Ni, Cu, Zn, Ge, Zr, Nb, Mo, Ag, Hf, Ta, W, Re and Au.

In accordance with various embodiments, a platinum group metal is used as the conductive fill layer in lieu of tungsten, which is used conventionally. As will be appreciated, tungsten deposition typically includes a halogen-containing (e.g., fluorine-containing) precursor, and a conformal barrier layer of TiN is commonly used between the silicide-forming liner and the tungsten fill layer as a diffusion barrier to inhibit fluorine diffusion into the adjacent structure, i.e., into the source/drain junction 300 or dielectric capping layer 500. Such a conformal layer of titanium nitride, which can occupy an appreciable volume of the trench, e.g., along the trench sidewalls, can adversely affect the electrical conductivity of the conductive contact. The use of a platinum group metal as the fill material, however, obviates the need for a fluorine barrier layer.

A barrier layer of titanium nitride may also serve as an oxidation barrier between the fill layer 770 and the trench sidewalls and/or a diffusion barrier between the fill layer 770 and the source/drain junction. In the former case, titanium nitride can inhibit the unwanted oxidation of the fill layer through reaction with the adjacent capping layer 500. In the latter case, titanium nitride can inhibit the inter-diffusion between the fill layer and the source/drain junction. However, in the case of the platinum group metals, which are not as prone to oxidation and diffusion as tungsten, an oxidation/diffusion barrier may not be needed.

Referring again to FIG. 4, the liner 710 and the fill layer 770 may be overgrown onto the upper surfaces of dielectric layer 600 outside of the trench 620. As will be appreciated by those skilled in the art, a planarization process can be used to remove the overburden, i.e., portions of the liner 710 and the fill material 770 deposited outside of the trench 620, i.e., over a top surface of the dielectric layer 600, to form a global planarized surface as shown in FIG. 6. A top surface of dielectric capping layer 500 may serve as a stopping layer. In certain embodiments, a surface of the conductive contact 700 is substantially co-planar with a surface of the dielectric capping layer 500, i.e., the upper surface of dielectric capping layer 500, the upper surface of the liner 710, and the upper surface of the fill material 770 are all coplanar with each other.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Figure 7:
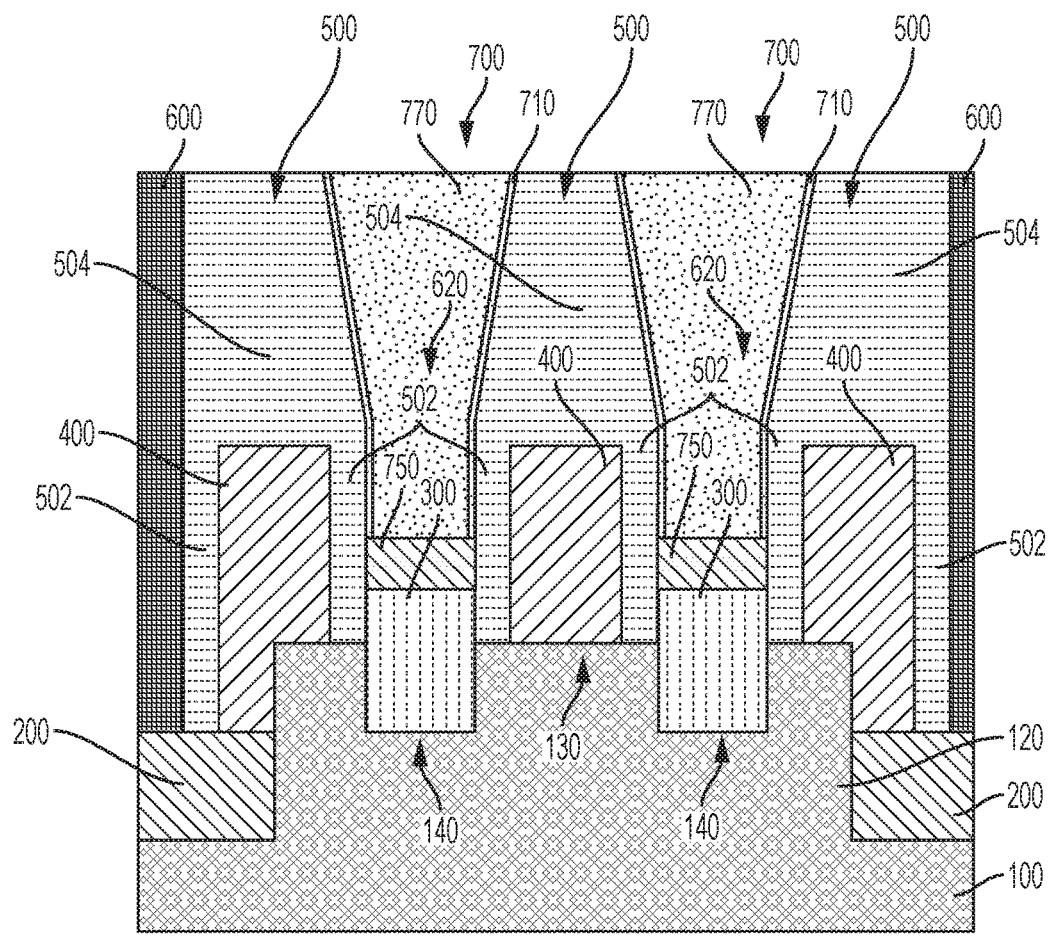
FIG. 7 depicts the structure of FIG. 6 following an annealing step and the attendant formation of a silicide layer at the conductive fill-source/drain junction interface.

FIG. 7 depicts the conductive contact 700 after an annealing step and the attendant formation of a silicide layer 750 between the conductive fill layer and the source/drain junction. The silicide layer 750 is the product of a solid state reaction between the liner 710 and the epitaxial source/drain junction 300. The thus formed conductive contact 700 is in electrical contact with epitaxial source/drain junction 300.

In embodiments where the liner comprises titanium, a laser anneal at 800° C. to 1000° C. can be used to form a titanium silicide layer 750. The thickness of the liner 710 at the bottom of the trench 620 can be selected such that the liner material at the bottom of the trench is fully consumed during silicidation. Thus, illustrated in FIG. 7 is an intermediate, post-planarization device architecture comprising a conductive contact 700 embedded within dielectric capping layer 500 and over source/drain junction 300. The conductive contact 700 is formed without a titanium nitride or other barrier layer within the trench 620.

Figure 8:
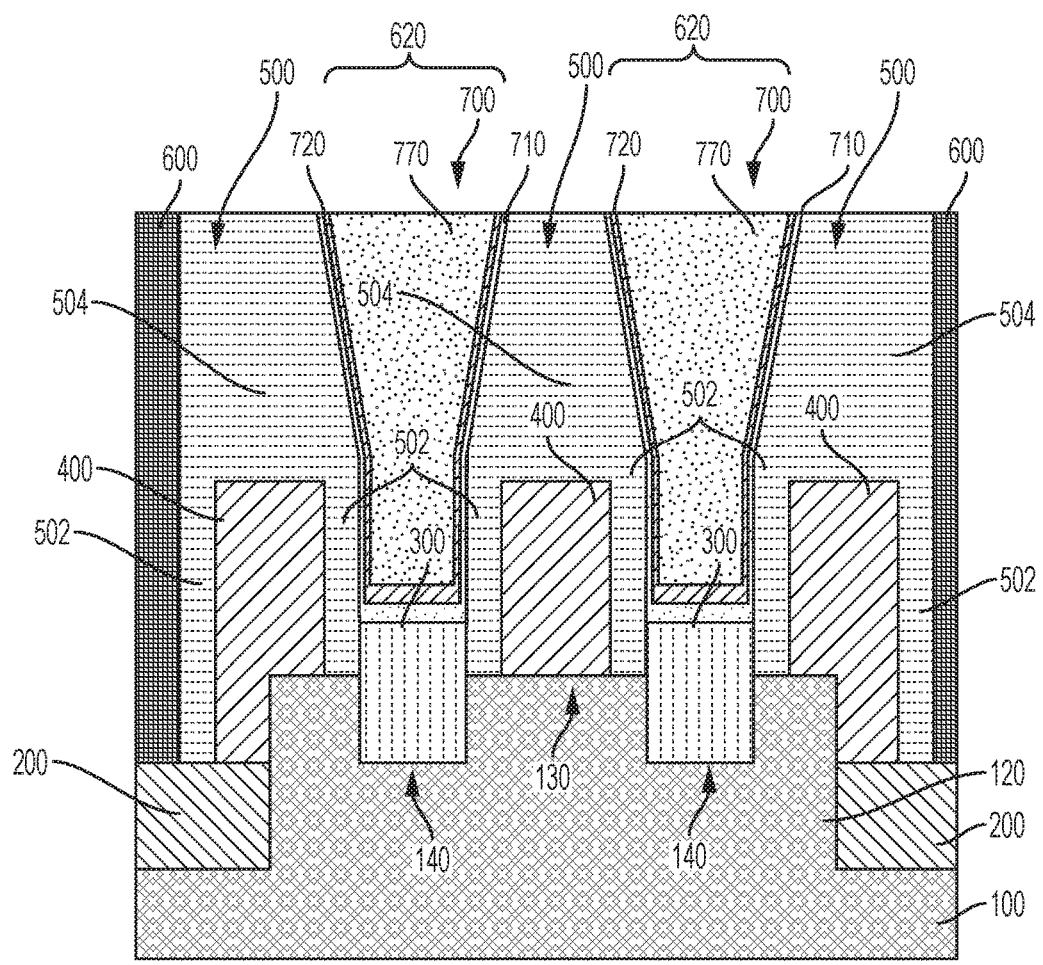
FIG. 8 shows a liner and a directionally-deposited barrier layer within the trench and the subsequent formation of a conductive fill layer comprising a platinum group metal according to further embodiments.

Referring to FIG. 8, and in accordance with embodiments, shown is a further conductive contact 700 at an intermediate stage of fabrication. The post-planarization structure of FIG. 8 includes the same elements, and can be manufactured using the same processes, described above with respect to FIG. 6, except the conductive contact 700 additionally includes a barrier layer 720 between the liner 710 and the conductive fill 770.

Thus, a method of forming the conductive contact including the formation of non-conformal barrier layer 720 such as, for example, a layer of TiN or TaN, over the liner 710 prior to deposition of the fill layer 770. Barrier layer 720 may be adapted to serve as a nucleation layer and/or adhesion layer for deposition of the fill layer 770, which fills the remaining portion of the trench 620. Furthermore, barrier layer 720 may inhibit the inter-diffusion of the fill layer 770 and the source/drain junction 300.

In lieu of a conformal deposition process to form the barrier layer 720, a collimated or other directional deposition process may be used. For instance, barrier layer 720 may be formed using physical vapor deposition (PVD) or other suitable processes for creating a non-conformal thin film. As used herein, the "non-conformal" deposition of a thin film or layer results in less than 100% step coverage, where the thin film or layer thickness over a first region thereof is not equal to the thin film or layer thickness over a second region thereof.

Without wishing to be bound by theory, the electrical resistance of a barrier layer 720, such as titanium nitride, deposited by physical vapor deposition (PVD) can be less than the electrical resistance of a barrier layer 720 deposited by atomic layer deposition (ALD). Furthermore, due to the directional nature of a PVD process, a PVD barrier layer occupies less volume within the trench, i.e., along the sidewalls, than an ALD barrier layer.

In particular embodiments, the thickness of the barrier layer 720 at the bottom of the trench may be greater than the thickness along the trench sidewalls. For instance, at the bottom of the trench the barrier layer 720 may have a thickness of 2 to 10 nm, while along the sidewalls of the trench the barrier layer 720 may have a thickness of 1 to 2 nm. In exemplary embodiments, a ratio of the barrier layer 720 thickness at the bottom of the trench to the barrier layer 720 thickness along the sidewalls of the trench can range from 2 to 10, e.g., 2, 4, 6, 8 or 10, including ranges between any of the foregoing values.

In the post-planarization structure, a surface of the conductive contact 700 is substantially co-planar with a surface of the dielectric capping layer 500, i.e., the upper surface of dielectric capping layer 500, the upper surface of the liner 710, the upper surface of the barrier layer 720, and the upper surface of the fill material 770 are all coplanar with each other.

Figure 9:
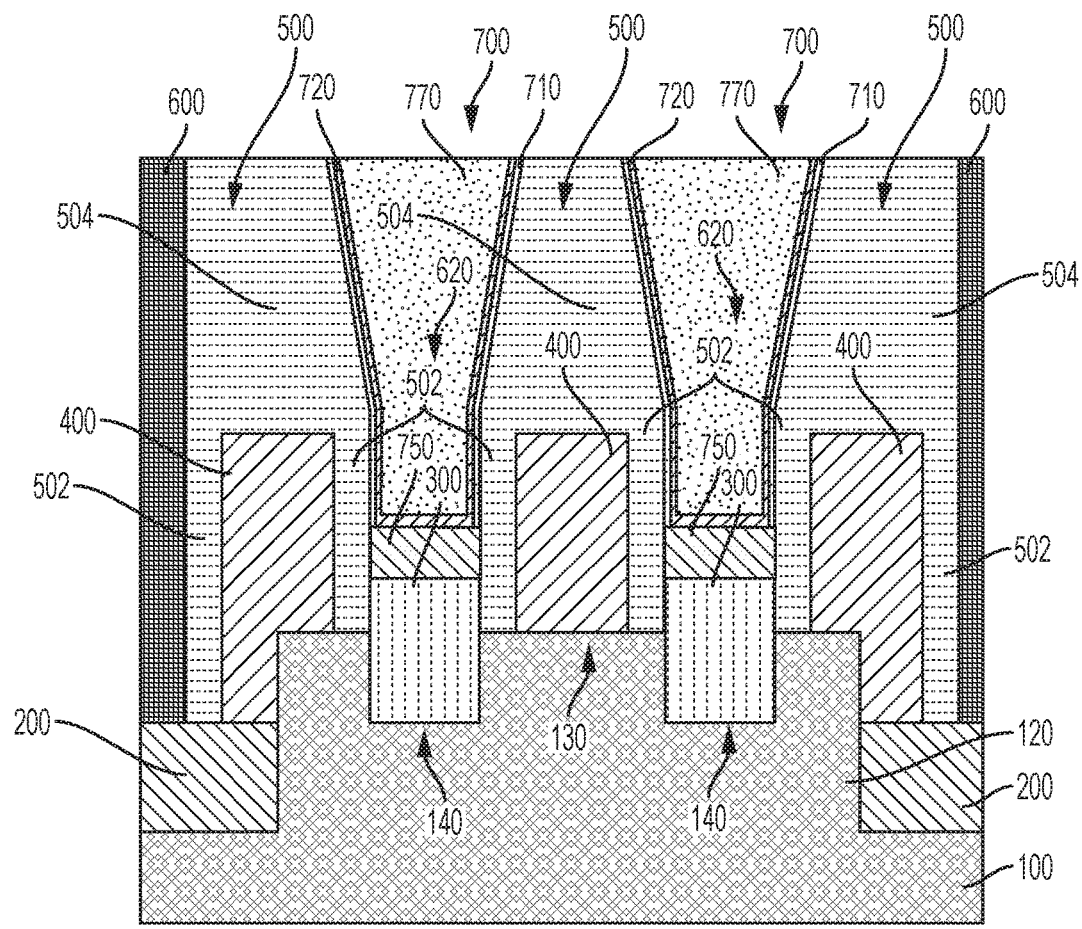
FIG. 9 shows the structure of FIG. 8 following an annealing step and the formation of a silicide layer at the barrier layer-source/drain junction interface.

FIG. 9 shows the structure of FIG. 8 following an annealing step and the formation of a silicide layer 750 between the barrier layer 720 and the source/drain junction 300. The structure of FIG. 9 includes a directionally-deposited liner 710 disposed over sidewalls of the trench 620, a directionally-deposited barrier layer 720 within the trench and disposed over the liner 710, and a conductive fill layer 770 comprising a platinum group metal filling the remaining portion of the trench. The conductive contact 700 is disposed within the trench 620 and is in electrical contact with epitaxial source/drain junctions 300.

As used herein, the singular forms "a," "an" and "the" include plural referents unless the context clearly dictates otherwise. Thus, for example, reference to a "barrier layer" includes examples having two or more such "barrier layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a fill metal that comprises ruthenium include embodiments where the fill metal consists essentially of ruthenium and embodiments where the fill metal consists of ruthenium.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor device, comprising:
    forming a gate structure on a channel portion of a semiconductor fin, wherein a source region and a drain region are present on opposing sides of the channel portion;
    forming an epitaxial layer over the source region and the drain region: forming a dielectric layer over the gate structure:
    forming a trench extending through the dielectric layer to an exposed surface of at least one of the source region or the drain region;
    forming a single metal liner over sidewalls of the trench and over the at least one of the source region or the drain region, such that the single metal liner continuously contacts each of the sidewalls of the trench and one of the source region or the drain region, wherein the single metal liner includes a metal silicide-forming metal; and
    forming a conductive fill material over the single metal liner and filling the trench, such that the conductive fill material continuously contacts the single metal liner, wherein the single metal liner physically separates the conductive fill material from the sidewalls of the trench and one of the source region or the drain region, and wherein the conductive fill material comprises a platinum group metal.

2. The method of claim 1, wherein the single metal liner comprises titanium and the conductive fill material comprises ruthenium.

3. The method of claim 1, wherein forming the single metal liner comprises physical vapor deposition.

4. The method of claim 1, wherein the single metal liner is formed directly over the at least one of the source region or the drain region.

5. The method of claim 1, wherein a ratio of a thickness of the single metal liner over the at least one of the source region or the drain region to a thickness of the single metal liner over the sidewalls of the trench is from 2 to 10.

6. A method of forming a semiconductor device, comprising:
    forming a gate structure on a channel portion of a semiconductor fin, wherein a source region and a drain region are present on opposing sides of the channel portion;
    forming an epitaxial layer over the source region and the drain region: forming a dielectric layer over the gate structure:
    forming a trench extending through the dielectric layer to an exposed surface of at least one of the source region or the drain region;
    forming a metal liner over sidewalls of the trench and over the at least one of the source region or the drain region, such that the metal liner continuously contacts each of the sidewalls of the trench and the source region or the drain region, wherein the metal liner includes a metal silicide-forming metal;
    forming a barrier layer on exposed surfaces of the metal liner with a downward directional deposition, wherein the barrier layer includes a lower portion having a first thickness and an upper portion having a second thickness, the second thickness being less than the first thickness; and
    forming a conductive fill material over the metal liner and filling the trench, such that the conductive fill material continuously contacts the barrier layer, wherein the barrier layer physically separates the conductive fill material from the metal liner, and wherein the conductive fill material comprises a platinum group metal.

7. The method of claim 6, wherein the barrier layer comprises titanium nitride (TiN).

8. The method of claim 7, wherein the metal liner comprises titanium (Ti) and the conductive fill material comprises ruthenium (Ru).

9. The method of claim 6, wherein forming the metal liner comprises physical vapor deposition.

10. The method of claim 6, wherein the metal liner is formed directly over one of the source region or the drain region, and wherein the metal liner physically separates the barrier layer from the source region or the drain region.

11. The method of claim 6, wherein a ratio of the first thickness of the lower portion of the barrier layer to the thickness of the upper portion of the barrier layer is from approximately 2 to approximately 10.

* * * * *